United States Patent [19]
Walther

[11] Patent Number: 5,887,004
[45] Date of Patent: Mar. 23, 1999

[54] ISOLATED SCAN PATHS

[75] Inventor: Ronald Gene Walther, Austin, Tex.

[73] Assignee: International Business Machines Corporation, Armonk, N.Y.

[21] Appl. No.: 829,521

[22] Filed: Mar. 28, 1997

[51] Int. Cl.⁶ ............................................. G01R 31/28
[52] U.S. Cl. ........................... 371/22.31; 371/22.32; 371/22.34
[58] Field of Search ............... 371/22.31, 22.32, 371/22.34; 324/158.1; 365/189.12, 194, 195, 201, 205

[56] References Cited

U.S. PATENT DOCUMENTS

| | | | |
|---|---|---|---|
| 4,495,629 | 1/1985 | Zasio et al. | 377/70 |
| 4,698,588 | 10/1987 | Hwang et al. | 324/73 R |
| 4,731,553 | 3/1988 | Van Lehn et al. | 307/443 |
| 4,782,283 | 11/1988 | Zasio | 324/73 R |
| 4,812,678 | 3/1989 | Abe | 307/443 |
| 4,855,623 | 8/1989 | Flaherty | 307/475 |
| 5,032,783 | 7/1991 | Hwang et al. | 324/73.1 |
| 5,107,148 | 4/1992 | Millman | 307/473 |
| 5,237,213 | 8/1993 | Tanoi | 307/290 |
| 5,392,297 | 2/1995 | Bell et al. | 371/22.6 |
| 5,444,288 | 8/1995 | Jacobs | 257/503 |

*Primary Examiner*—Hoa T. Nguyen
*Attorney, Agent, or Firm*—Anthony V.S. England; Jack V. Musgrove; Andrew J. Dillon

[57] ABSTRACT

A method of isolating scan paths in an integrated circuit to reduce the RC delay associated with the scan paths and reduce power consumption, and to further enhance the capacitive decoupling of the power supply to reduce noise. The scan path can be connected to a data-storage element (latch or flip-flop) by a CMOS transmission gate, a single PMOS or NMOS transistor, or a logic gate (such as a NAND gate). The data-storage element is tested using either a scan-enable line, or the scan clock which is also connected to the data-storage element as an input. When the scan-enable line (or scan clock) is turned on, the scan path is connected to the output of the data-storage element.

21 Claims, 3 Drawing Sheets

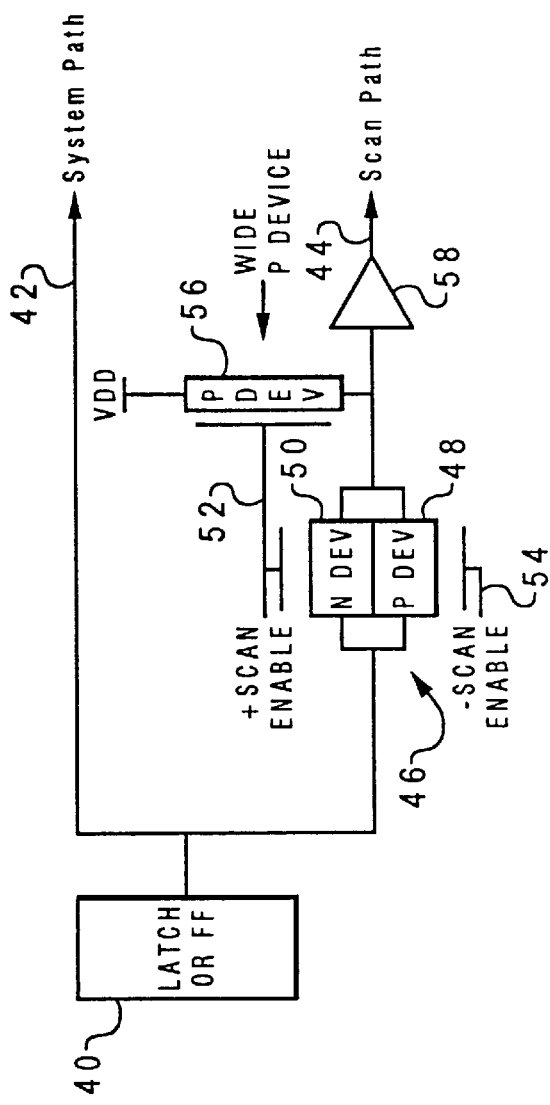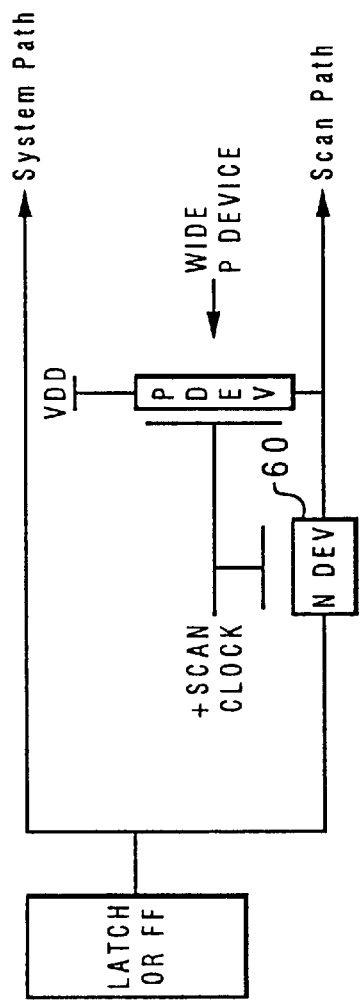

ISOLATED SCAN PATHS

BACKGROUND OF THE INVENTION

1. Field of the Invention

The present invention generally relates to integrated circuits and, more particularly, to a method of isolating scan paths used for testing logic designs.

2. Description of the Prior Art

Integrated circuits are used in a wide variety of products, and many of these circuits, such as microprocessors, adapter chips, etc., have complicated logic designs. These designs are often buried in the microchip layers and can be difficult to test. A generalized integrated circuit is shown in FIG. 1. Circuit 10 includes several logic function circuits 12, 14, 16, and 18 and several flip-flops, or latches, 20, 22, 24, 26, and 28. The logic functions have various inputs, and their outputs are connected to various latches; for example, logic function 12 has four outputs respectively connected to latches 20–26. Each logic function has many logic components (gates, inverters, etc.) arranged to provide a particular function, such as an adder or execution unit. The latches store data, and may provide inputs to other logic functions, such as latches 20 and 24 which are connected to logic function 16. Circuit 10 may have one or more latches such as 28, which provides the output of the circuit. A clock signal 30 provides synchronization (control) for the latches. The clock may be a primary input to the circuit or internally generated.

Those skilled in the art will appreciate that, in this example, the circuit is greatly simplified since there are many more logic functions and latches in a typical integrated circuit, the logic functions can further be very complicated, and more than one clock signal can be provided. This figure is still adequate, however, for understanding how testing of the circuit can be performed. One method involves the use of test patterns which are fed into the primary inputs of the circuit while the output is examined. This approach is limited by the structure of the logic design and may fail to catch unusual flaws in a particular design.

Another testing approach is to provide a mechanism for setting the latches to predefined states using special lines which are provided on the microchip, such as scan line 32 which is connected directly to latch 20, and scan line 34 which directly interconnects latch 20 with latch 28 (other scan lines, not shown, can be provided for other latches, depending upon the type of scan implementation). Separate control can be provided for scanning the latches, using a test clock 36. A scan output line 38 may also be provided. Conventional scan designs include the multiplexed D Flip-Flop scan design, and IBM's Level Sensitive Scan Design (LSSD). See also U.S. Pat. Nos. 4,698,588, 4,782,283, and 5,032,783.

Logic designs using such scan techniques suffer some system delay penalty due to the extra loading on the latches/flip-flops which arise from the scan path wires. In other words, it takes longer for the output of the latch to change its state because of the required charging (or discharging) of the scan lines; this delay is a function of the RC constant of the wire. The delay occurs whether the system is being tested or not, i.e., the loads are not needed for normal system function, and so, it slows down normal operation of the circuit. Conversely, if the circuit is run at a very high clock speed, logic errors may occur.

Additional problems arise from scan paths, such as excess power consumption and power-supply noise due to varying switching activity (between high and low states) during circuit operation. Scan path switching (from zero to one or one to zero) unnecessarily adds to circuit power consumption and power-supply noise. It would, therefore, be desirable to devise a method of isolating the scan paths during normal circuit operation so as to not slow down performance, and it would be particularly advantageous if the method also reduced power consumption and unnecessary switching noise. Techniques such as those shown in U.S. Pat. No. 4,495,629 achieve some of these objectives, but require modifying system scannable storage elements, which can introduce additional limitations.

SUMMARY OF THE INVENTION

It is therefore one object of the present invention to provide an improved scan technique for testing integrated circuits.

It is another object of the present invention to provide such a scan technique in which scan lines can be selectively isolated from the normal circuit lines so as to minimize or eliminate unnecessary RC delays.

It is yet another object of the present invention to provide a scan technique which isolates the scan lines in such a manner as to further reduce power consumption and switching noise.

The foregoing objects are achieved in a method of scanning a data-storage element (e.g., a latch or flip-flop) in an integrated circuit, generally comprising the steps of providing a scan-line output for transmitting an output test signal, the scan-line output being isolated from the output of the data-storage element during a regular-operation mode of the integrated circuit to reduce any RC delay associated with the scan-line output, and the scan-line output further being connected to the power supply during the regular-operation mode to increase the power supply's decoupling capacitance, and switching the integrated circuit from the regular-operation mode to a test-operation mode wherein the scan-line output is connected to the output of the data-storage element. In one embodiment, the scan-line output is connected to the output of the data-storage element by a CMOS transmission gate, and the switching step is accomplished by switching the CMOS transmission gate from a non-conducting state to a conducting state. In an alternative embodiment, the scan-line output is connected to the output of the data-storage element by a logic gate (such as a NAND gate), and said switching step is accomplished by changing the state of an input of the logic gate. The switching step can be accomplished using either a scan-enable line or the scan clock which is also connected to the data-storage element as an input. A buffer may be provided to speed transmission of any output test signal on the scan-line output.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

FIG. 2 is a schematic diagram depicting one method of isolating a scan line according to the present invention, using a CMOS transmission gate and a scan-enable line;

FIG. 3 is a schematic diagram depicting another method of isolating a scan line according to the present invention, using a single transistor controlled by the scan clock.

DESCRIPTION OF THE PREFERRED EMBODIMENT

Figure 1:
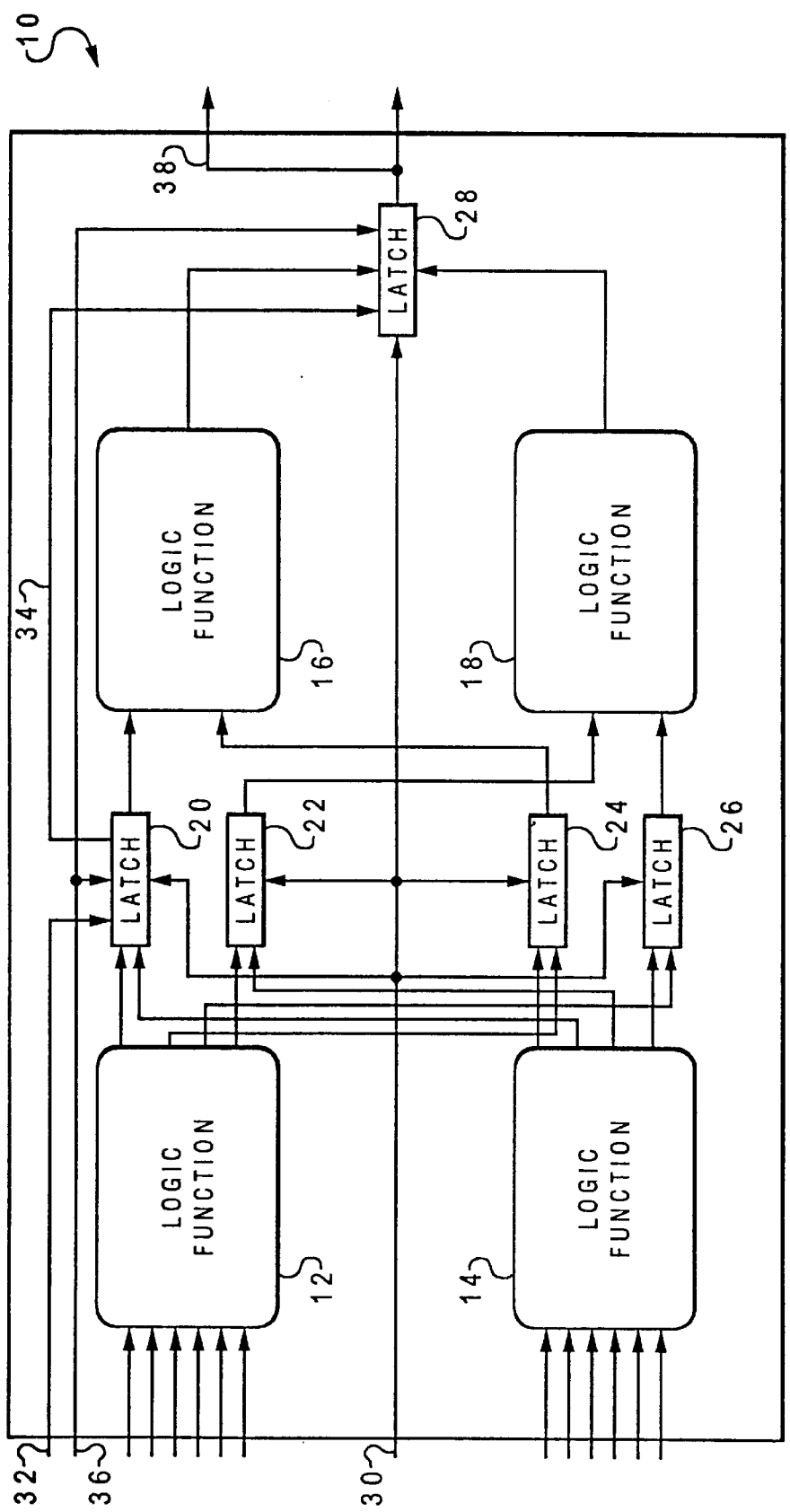
FIG. 1 is a simplified block diagram of a conventional integrated circuit.

With reference now to the figures, and in particular with reference to FIG. 2, there is depicted one embodiment of an isolated scan path according to the present invention which is provided to allow testing of data-storage elements in an integrated circuit including, without limitation, a computer processor or an adapter chip for a computer peripheral. The isolated scan path may be implemented in any type of integrated circuit, including circuits which are otherwise conventional (i.e., those similar to FIG. 1), but it could also be used in circuits having additional novel elements. Therefore, application of the invention should not be considered as limited to any particular logic design, and certainly not limited to the particular example of FIG. 1.

The scan design includes a data-storage element or latch 40 having an output which is connected to a system path 42 and to a scan path 44 via a CMOS transmission gate 46. Latch 40 also has one or more inputs from logic functions, a system clock control input and a scan input; these inputs are not shown in FIG. 2 (or in FIGS. 3–4) but are generally similar to the latch inputs shown in FIG. 1. Transmission gate 46 includes a PMOS transistor 48 and a NMOS transistor 50 connected in parallel. The gate of NMOS transistor 50 is controlled by a "scan enable" line 52 which is turned on (set to a high-voltage state) during testing of the circuit (scanning), but is turned off (set to a low-voltage state) during regular operation of the circuit. The gate of PMOS transistor 48 is controlled by a line 54 which is the complement to the scan-enable line 52, i.e., scan enable complement line 54 is normally turned on during regular operation of the circuit but is turned off during scanning. The scan enable and complement lines can be added to most existing logic design layouts.

Transmission gate 46 isolates the scan path wiring from system latches or flip-flop outputs. When the circuit is in normal operation, PMOS 48 is turned off since the scan enable complement line 54 is turned on, and NMOS 50 is also turned off since the scan-enable line 52 is turned off (i.e., the transmission gate is in a non-conducting state). This isolation prevents the scan path from loading down these latch or flip-flop outputs, which would otherwise increase their delay. When scanning is performed, PMOS 48 is turned on since the scan enable complement line 54 is turned off, and NMOS 50 is also turned on since the scan-enable line 52 is turned on, allowing the signal to pass along the scan-line output 44.

Another PMOS transistor 56 is connected to scan line 44 on the output side of CMOS transmission gate 46, with the source of the transistor connected to the power supply ($V_{dd}$). The gate of PMOS transistor 56 is also connected to scan-enable line 52. PMOS transistor 56 is used to connect the power supply to the scan line during normal system operation thus allowing the scan line to act as a decoupling capacitance, thereby reducing noise during normal operation.

The scan path may be slowed down if the devices in CMOS transmission gate 46 are weak, so an optional buffer 58 can be added to the scan path to speed up the signal. Other conventional components may be added depending upon the particular desired characteristics of the scan design.

FIG. 3 illustrates another embodiment of a scan design according to the present invention. In this design, an NMOS transistor 60 is used to isolate the scan path. This implementation allows the transistor to be controlled by a scan clock signal, so that special scan-enable lines (used in the embodiment of FIG. 2) are not required. A scan-enable line may be preferable over use of the scan clock signal, however, to avoid race conditions. NMOS transistor 60 is normally turned off (during regular operation of the circuit) since the scan clock is never turned on during regular operation, again isolating the scan path. This design also illustrates that the CMOS transmission gate can be replaced with other switching components, not only with the depicted NMOS transistor 60, but alternatively with, e.g., a PMOS transistor as well.

Figure 4:
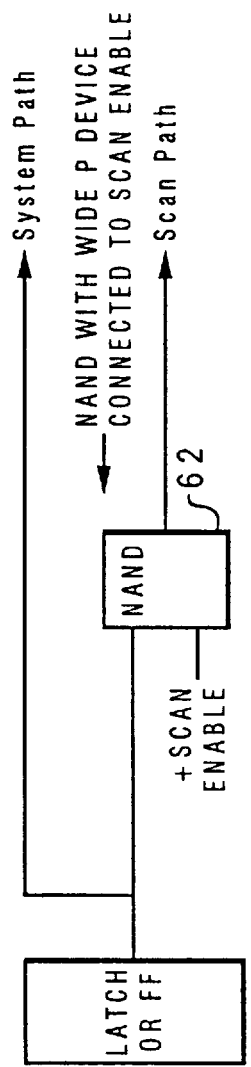
FIG. 4 is a schematic diagram depicting yet another method of isolating a scan line according to the present invention, using a logic component connected to a scan-enable line.

FIG. 4 illustrates how the CMOS transmission gate can further be replaced with a logic gate, e.g., a NAND gate 62. The gate is shown as being controlled by the scan enable signal but it could also be controlled by a scan clock signal that is always at its inactive state during normal circuit operation. NAND gate 62 prevents switching noise since it constantly maintains the output at a high state during normal operation, i.e., the scan enable signal will be turned off (low) which will always result in the output of NAND gate 62 being high, regardless of the state of the other NAND input (the output of the latch). Those skilled in the art will appreciate that other logic gates (AND, OR, NOR) can also be used.

Both of the circuits of FIG. 3 and FIG. 4 may be modified further, such as by adding the optional buffer shown in FIG. 2 or by adding other conventional components. It is also understood that, while FIGS. 2–4 dipict scan designs for only a single latch, these designs (as well as other implementations of the invention) may be repeated or combined for any number of data-storage elements in the integrated circuit. The scan-line outputs (scan paths) may be connected to output ports of the integrated circuit, or to the inputs of other latches or logic functions in the integrated circuit.

The isolation provided with the foregoing designs prevents the scan path wire and its loads from switching during normal operation, thus decreasing chip power and power-supply noise. Furthermore, the isolated scan path wires are connected to the power supply grid via a switch which increases the decoupling capacitance attached to the power-supply grid, reducing the magnitude of power-supply noise during normal circuit operation.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

I claim:

1. A method of scanning a data-storage element in an integrated circuit, the data-storage element having a power supply and an output, comprising the steps of:

providing a scan-line output for transmitting an output test signal, the scan-line output being isolated from the output of the data-storage element during a regular-operation mode of the integrated circuit to reduce RC delay associated with the scan-line output, and the scan-line output further being connected to the power supply to increase its capacitance during the regular-operation mode; and switching the integrated circuit from the regular-operation mode to a test-operation mode wherein the scan-line output is connected to the output of the data-storage element.

2. The method of claim 1 wherein the scan-line output is connected to the output of the data-storage element by a CMOS transmission gate, and said switching step is accomplished by switching the CMOS transmission gate from a non-conducting state to a conducting state.

3. The method of claim 2 wherein:

the CMOS transmission gate includes a PMOS transistor and an NMOS transistor;

a gate of the NMOS transistor is controlled by a scan-enable line which is turned on during the test-operation mode and turned off during the regular-operation mode; and a gate of the PMOS transistor is controlled by a scan enable complement line which is turned on (to a high-voltage state) during the regular operation and turned off (to a low-voltage state) during the test-operation mode.

4. The method of claim 1 wherein the scan-line output is connected to the output of the data-storage element by a logic gate, and said switching step is accomplished by changing the state of an input of the logic gate.

5. The method of claim 4 wherein the logic gate is a NAND gate and the input thereof is connected to a scan-enable line which is turned off (to a low-voltage state) during the regular-operation mode but is turned on (to a high-voltage state) during the test-operation mode.

6. The method of claim 4 wherein the logic gate is an AND gate and the input thereof is connected to a scan-enable line which is turned off (to a low-voltage state) during the regular-operation mode but is turned on (to a high-voltage state) during the test-operation mode.

7. The method of claim 4 wherein the logic gate is an OR gate and the input thereof is connected to a scan enable complement line which is turned on (to a high-voltage state) during the regular-operation mode but is turned off (to a low-voltage state) during the test-operation mode.

8. The method of claim 4 wherein the logic gate is a NOR gate and the input thereof is connected to a scan enable complement line which is turned on (to a high-voltage state) during the regular-operation mode but is turned off (to a low-voltage state) during the test-operation mode.

9. The method of claim 1 further comprising the step of providing a buffer to speed transmission of any output test signal on the scan-line output.

10. The method of claim 1 wherein said switching step is accomplished using a scan-enable line which is turned off during the regular-operation mode but is turned on during the test-operation mode.

11. The method of claim 1 wherein the data-storage element also has a scan clock input, and said switching step occurs in response to the scan clock input changing from a low state to a high state.

12. The method of claim 1 wherein the data-storage element also has a scan-line input, and further comprising the step of transmitting an input test signal to the data-storage element via the scan-line input.

13. An integrated circuit comprising:

at least one data-storage element having an input and an output;

at least one logic function having primary inputs, and an output connected to said input of said data-storage element;

a scan path; and means for selectively (i) isolating said scan path from said output of said data-storage element during a regular-operation mode of the integrated circuit to reduce RC delay associated with said scan path, and (ii) connecting said scan path to said output of said data-storage element during a test-operation mode of the integrated circuit.

14. The integrated circuit of claim 13 further comprising means for connecting a power supply to said scan path during the regular-operation mode.

15. The integrated circuit of claim 14 wherein said means for connecting said power supply includes a transistor having a source connected to said power supply and a drain connected to said scan path.

16. The integrated circuit of claim 15 wherein:

said transistor is a PMOS transistor; and said means for selectively isolating and connecting said scan path to said power supply includes a scan-enable line for controlling said PMOS transistor, which is turned off (to a low-voltage state) during said regular-operation mode but is turned on (to a high-voltage state) during said test-operation mode.

17. The integrated circuit of claim 13 wherein said means for selectively isolating and connecting said scan path includes a CMOS transmission gate.

18. The integrated circuit of claim 13 wherein said means for selectively isolating and connecting said scan path includes a PMOS transistor.

19. The integrated circuit of claim 13 wherein said means for selectively isolating and connecting said scan path includes an NMOS transistor.

20. The integrated circuit of claim 13 wherein said means for selectively isolating and connecting said scan path includes a logic gate.

21. The integrated circuit of claim 13 wherein said data-storage element further has a scan input.

* * * * *